(12) United States Patent
Akiyama et al.

(10) Patent No.: US 7,919,811 B2
(45) Date of Patent: Apr. 5, 2011

(54) SEMICONDUCTOR DEVICE AND METHOD FOR MANUFACTURING SAME

(75) Inventors: Miwako Akiyama, Tokyo (JP); Yusuke Kawaguchi, Kanagawa-ken (JP); Yoshihiro Yamaguchi, Saitama-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 222 days.

(21) Appl. No.: 12/122,165

(22) Filed: May 16, 2008

(65) Prior Publication Data

US 2008/0283909 A1 Nov. 20, 2008

(30) Foreign Application Priority Data

May 18, 2007 (JP) .................... 2007-133342

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .. 257/330; 257/328; 257/329; 257/E29.118

(58) Field of Classification Search .................. 257/330, 257/328, 329, E29.118
See application file for complete search history.

(56) References Cited

U.S. PATENT DOCUMENTS

| 6,734,494 | B2  | 5/2004 | Ohtani |
| 7,061,047 | B2* | 6/2006 | Ono et al. ............ 257/330 |
| 7,161,208 | B2* | 1/2007 | Spring et al. ......... 257/328 |
| 7,166,891 | B2  | 1/2007 | Yoshimochi |
| 7,230,297 | B2  | 6/2007 | Ono et al. |
| 2006/0208314 | A1 | 9/2006 | Kaneko |

FOREIGN PATENT DOCUMENTS

| JP | 11-354780 | 12/1999 |
| JP | 2003-533889 | 11/2003 |
| JP | 2004-303964 | 10/2004 |
| JP | 3677489 | 5/2005 |
| JP | 2007-59632 | 3/2007 |
| JP | 2007-110047 | 4/2007 |
| WO | WO 2006/134810 | 12/2006 |

* cited by examiner

*Primary Examiner* — Thien F Tran
(74) *Attorney, Agent, or Firm* — Oblon, Spivak, McClelland, Maier & Neustadt, L.L.P.

(57) ABSTRACT

A semiconductor device includes a second-conductivity-type base region provided on a first-conductivity-type semiconductor layer, a first-conductivity-type source region provided on the second-conductivity-type base region, a gate insulating film covering an inner wall of a trench which passes through the second-conductivity-type base region and reaching the first-conductivity-type semiconductor layer, a gate electrode buried in the trench via the gate insulating film, and a second-conductivity-type region being adjacent to the second-conductivity-type base region below the first-conductivity-type source region, spaced from the gate insulating film, and having a higher impurity concentration than the second-conductivity-type base region. $c \geq d$ is satisfied, where d is a depth from an upper surface of the first-conductivity-type source region to a lower end of the gate electrode, and c is a depth from an upper surface of the first-conductivity-type source region to a lower surface of the second-conductivity-type base region.

9 Claims, 14 Drawing Sheets

SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2007-133342, filed on May 18, 2007; the entire contents of which are incorporated herein by reference.

BACKGROUND OF THE INVENTION

1. Field of the Invention

This invention relates to a vertical MOS gate power semiconductor device and a method for manufacturing the same.

2. Background Art

Low breakdown voltage MOSFETs (metal oxide semiconductor field effect transistors) are widely used in AC adapters for notebook personal computers and LCDs (liquid crystal displays) as well as switching power supplies for servers. Conventional examples include a vertical MOSFET having a trench structure in which the current path extends in the thickness direction of the substrate along the sidewall of the trench (see, e.g., Japanese Patent No. 3677489).

An important parameter of such a MOSFET is the product, $R_{ON} \times Q_{SW}$, of the on-resistance $R_{ON}$, which is the source-drain resistance, and the gate-drain charge $Q_{SW}$ (called like "Q-switch") at the switching time. While $R_{ON}$ and $Q_{SW}$ are in a tradeoff relationship, it is desired to reduce both of them for speedup.

SUMMARY OF THE INVENTION

According to an aspect of the invention, there is provided a semiconductor device including: a second-conductivity-type base region provided on a first-conductivity-type semiconductor layer; a first-conductivity-type source region provided on the second-conductivity-type base region; a gate insulating film covering an inner wall of a trench which passes through the second-conductivity-type base region and reaching the first-conductivity-type semiconductor layer; a gate electrode buried in the trench via the gate insulating film; and a second-conductivity-type region being adjacent to the second-conductivity-type base region below the first-conductivity-type source region, spaced from the gate insulating film, and having a higher impurity concentration than the second-conductivity-type base region, $c \geq d$ being satisfied, where d is a depth from an upper surface of the first-conductivity-type source region to a lower end of the gate electrode, and c is a depth from an upper surface of the first-conductivity-type source region to a lower surface of the second-conductivity-type base region.

According to another aspect of the invention, there is provided a method for manufacturing a semiconductor device, including: forming a second-conductivity-type region on a first-conductivity-type semiconductor layer; forming a first trench passing through the second-conductivity-type region and reaching the first-conductivity-type semiconductor layer; and forming a second-conductivity-type base region having a lower impurity concentration than the second-conductivity-type region and being adjacent to the first trench by obliquely introducing a first-conductivity-type impurity into an inner sidewall of the first trench.

According to another aspect of the invention, there is provided a method for manufacturing a semiconductor device, including: forming a first trench in a first-conductivity-type semiconductor layer; forming a gate insulating film on an inner sidewall of the first trench and burying a gate electrode in a remaining space thereof; forming a second-conductivity-type base region shallower than the first trench by introducing a second-conductivity-type impurity into the first-conductivity-type semiconductor layer from a wafer surface; forming a second trench passing through the second-conductivity-type base region and reaching the first-conductivity-type semiconductor layer; and burying a second-conductivity-type semiconductor having a higher concentration than the second-conductivity-type base region in the second trench to form a second-conductivity-type region.

DETAILED DESCRIPTION OF THE INVENTION

Embodiments of the invention will now be described with reference to the drawings.

Figure 1:
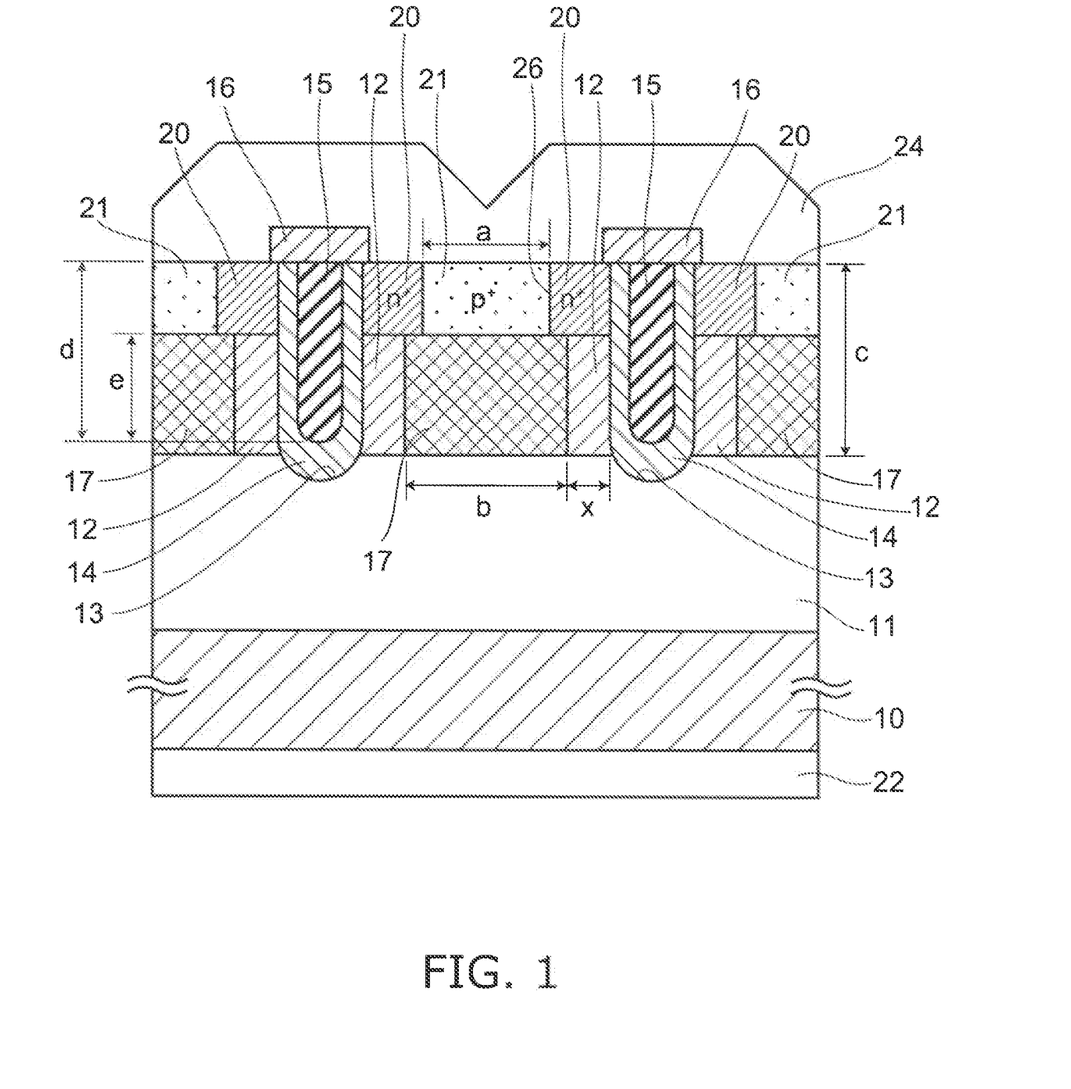
FIG. 1 is a schematic cross-sectional view of a semiconductor device according to an embodiment of the invention.

FIG. 1 is a schematic cross-sectional view of a semiconductor device according to an embodiment of the invention.

A first-conductivity-type epitaxial layer 11 is formed on a low-resistance, first-conductivity-type substrate (n-type semiconductor substrate) 10. A UMOS structure having a gate trench is formed on the first-conductivity-type epitaxial layer 11. More specifically, a trench 13 is formed in a second-conductivity-type base region 12, and a gate electrode 15 is buried therein via a gate oxide film 14. A highly-doped first-conductivity-type (n⁺) source region 20 is formed on the second-conductivity-type base region 12. Furthermore, in this embodiment, a highly-doped second-conductivity-type region 17 is provided adjacent to the second-conductivity-type base region 12. The impurity concentration in the second-conductivity-type base region 12 can be approximately $1\times10^{17}$ cm$^{-3}$, and the impurity concentration in the highly-doped second-conductivity-type region 17 can be approximately $1.8\times10^{17}$ to $3\times10^{17}$ cm$^{-3}$. A second-conductivity-type contact region 21 is provided on the second-conductivity-type region 17.

A drain electrode 22 is provided on the backside of the first-conductivity-type substrate 10, and a source electrode 24 is provided on the first-conductivity-type source region 20 and the second-conductivity-type contact region 21. The gate electrode 15 and the source electrode 24 are insulated from each other by an interlayer insulating film 16.

In the semiconductor device of this embodiment, by decreasing the channel length, the resistive component in the second-conductivity-type base region 12 is reduced, and hence the on-resistance $R_{ON}$ can be decreased. Simultaneously, because the gate electrode 15 can be made shallower, the parasitic capacitance can be decreased, and thereby the gate-drain charge $Q_{SW}$ can also be decreased. Thus, both $R_{ON}$ and $Q_{SW}$ can be decreased by decreasing the length of the channel, and the switching speed can be enhanced.

Decreasing the channel length inevitably results in decreasing the volume of the second-conductivity-type base region 12. Hence the short channel effect causes the so-called "punch-through", where a depletion layer extends from the first-conductivity-type epitaxial layer 11 into the second-conductivity-type base region 12 and reaches the first-conductivity-type source region 20 directly above the second-conductivity-type base region 12. The short channel effect is prominently manifested when the amount of projection of the trench gate extending downward from the second-conductivity-type base region 12 is small. If punch-through occurs, the semiconductor device cannot be turned off.

In contrast, in this embodiment, a highly-doped second-conductivity-type region 17 is provided to prevent the depletion layer from extending from the first-conductivity-type epitaxial layer 11 into the second-conductivity-type base region 12. Thus punch-through in the second-conductivity-type base region 12 due to the short channel effect can be prevented. That is, even if the channel length is decreased, the leak current due to punch-through can be prevented, and the switching speed can be enhanced by reducing both $R_{ON}$ and $Q_{SW}$.

Figure 2:
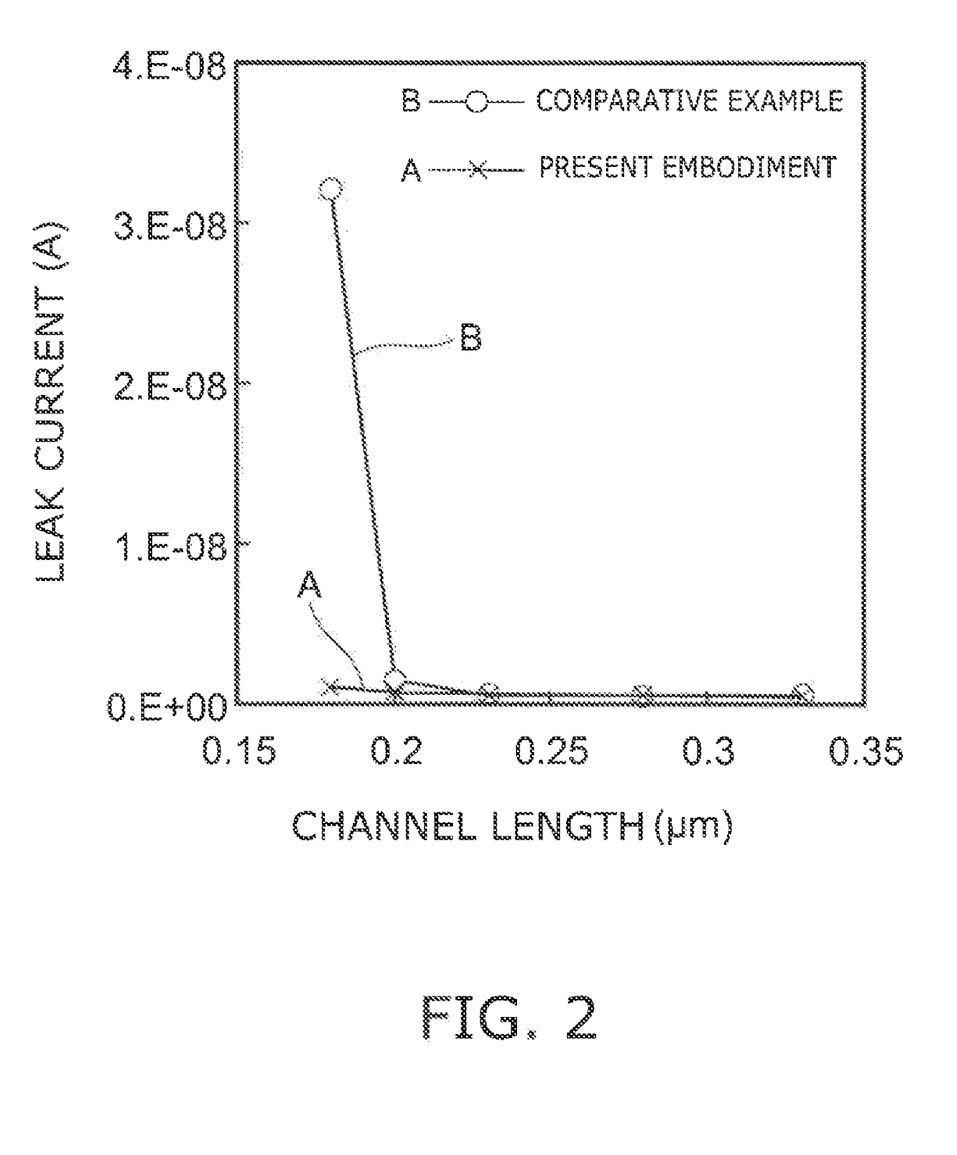
FIG. 2 is a graph showing the relationship between the channel length and the source-drain leak current.

FIG. 2 is a graph showing the relationship between the channel length and the source-drain leak current.

More specifically, in a semiconductor device (rated at 30 volts) of the trench MOS structure shown in FIG. 1, the channel length and the leak current (the current flowing through the channel when the gate and the source are short-circuited and a rated voltage of 30 volts is applied to the drain) were characterized, where the total thickness c of the second-conductivity-type base region 12 and the source region 20 was 0.5 μm, and the channel length e was 0.18 to 0.33 μm. Furthermore, a comparative example, in which the highly-doped second-conductivity-type region 17 is omitted in the structure shown in FIG. 1, was characterized likewise for comparison purposes.

As a result, it was found that, in the comparative example (B) with no highly-doped second-conductivity-type region 17, the leak current sharply increased for a channel length of 0.2 μm or less. This is presumably because of punch-through in the second-conductivity-type base region 12. In contrast, in the structure of this embodiment provided with the highly-doped second-conductivity-type region 17, the extension of the depletion layer in the second-conductivity-type base region 12 can be prevented. As shown in FIG. 2, little leak current is produced even if the channel length is decreased to 0.18 μm.

It was also found that the distance x from the oxide film 14 of the trench gate to the highly-doped second-conductivity-type region 17 is important in preventing the leak current.

Figure 3A:
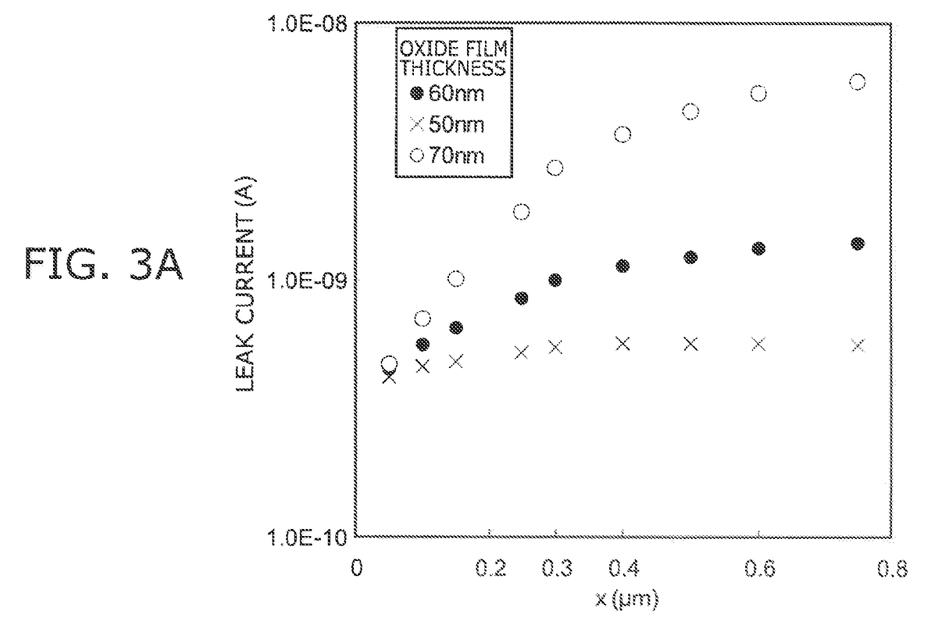
FIGS. 3A and 3B are graphs showing the relationship between the distance x and the leak current where the thickness of the gate oxide film 14 is varied as 50 nm, 60 nm, and 70 nm.
Figure 3B:
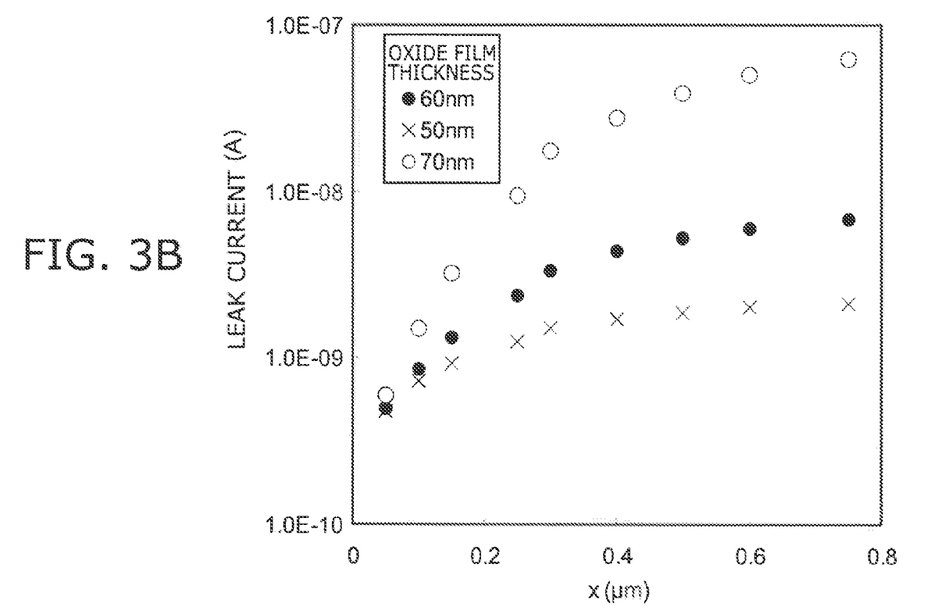

FIG. 3 is a graph showing the relationship between the distance x and the leak current where the thickness of the gate oxide film 14 is varied as 50 nm, 60 nm, and 70 nm.

The calculation here was made on the structure with a spacing of 1.5 μm between adjacent trench gates. That is, x=0.75 μm corresponds to the case with no highly-doped second-conductivity-type region 17. If the gate oxide film 14 is thickened, the threshold (the gate voltage for a drain current of 1 μA) increases. Hence the concentration in the second-conductivity-type base region 12 was adjusted to keep the threshold constant. The threshold for x=0.75 μm is set to 1.3 V and 1.1 V, and the concentration in the highly-doped second-conductivity-type region 17 is held constant at $2.3\times10^{17}$ cm$^{-3}$.

FIGS. 3A and 3B show calculation results for a threshold of 1.3 V and 1.1 V, respectively. It turns out that, for both oxide film thicknesses, the leak current is large for the distance x larger than 0.3 μm, but sharply decreases for a distance x of 0.3 μm or less. That is, irrespective of the thickness of the gate oxide film 14 and the concentration in the second-conductivity-type base region 12, the leak current can be reduced by decreasing the distance x to 0.3 μm or less.

Figure 4:
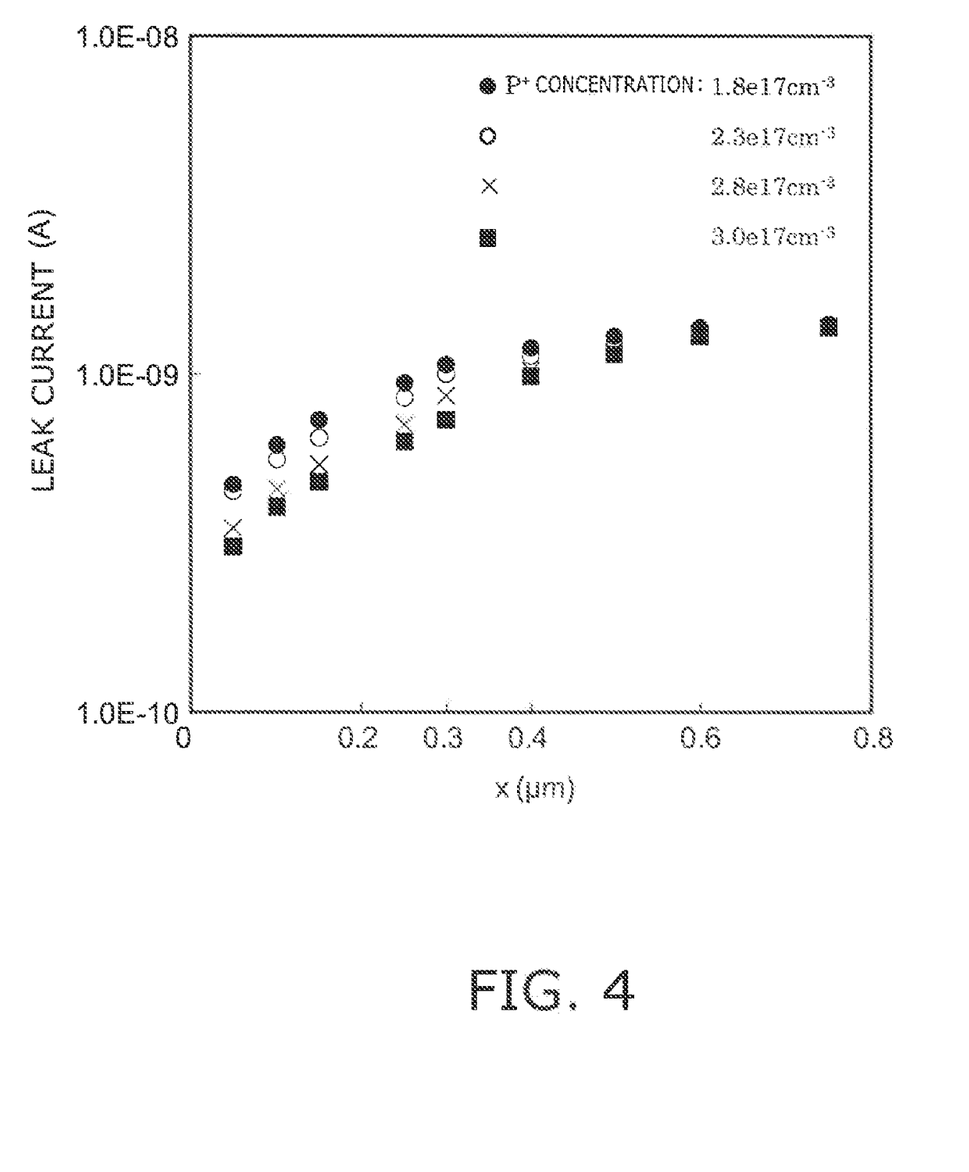
FIG. 4 is a graph showing the relationship between the distance x and the leak current where the dose amount in the highly-doped second-conductivity-type region 17 is varied.

FIG. 4 is a graph showing the relationship between the distance x and the leak current where the dose amount in the highly-doped second-conductivity-type region 17 is varied as $1.8\times10^{17}$ cm$^{-3}$, $2.3\times10^{17}$ cm$^{-3}$, $2.8\times10^{17}$ cm$^{-3}$, and $3.0\times10^{17}$ cm$^{-3}$. In any of these cases, the concentration in the second-conductivity-type base region 12 was $1.0\times10^{17}$ cm$^{-3}$, and the thickness of the gate oxide film 14 was 60 nm.

With the increase of the dose amount in the second-conductivity-type region 17, the effect of decreasing the leak current tends to be more prominent. It turns out that in any case, the leak current definitely starts to decrease for the distance x from the oxide film 14 of the trench gate to the highly-doped second-conductivity-type region 17 being ≦0.3 μm. From the result shown in FIG. 4, the relationship between the dose amount f in the second-conductivity-type region 17 and the distance x can be expressed by the following formula:

$$x=0.14\times f\times 10^{-17}+0.022$$

Thus, by making the distance x not larger than the above-identified formula, the leak current can be effectively decreased.

Figure 5:
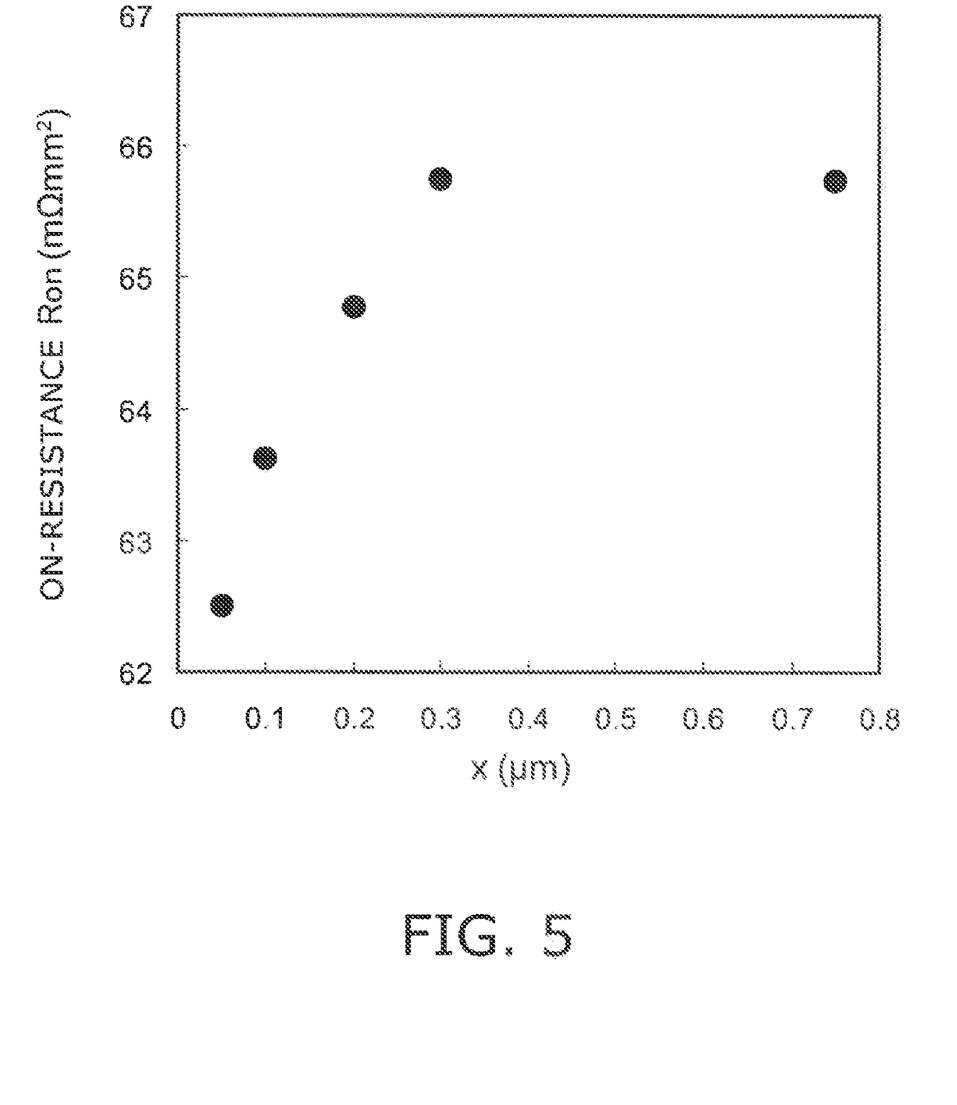
FIG. 5 is a graph showing the relationship of the on-resistance $R_{ON}$ to the distance x from the oxide film 14 of the trench gate to the highly-doped second-conductivity-type region 17.

FIG. 5 is a graph showing the relationship of the on-resistance $R_{ON}$ to the distance x from the oxide film 14 of the trench gate to the highly-doped second-conductivity-type region 17.

Here, the concentration in the second-conductivity-type base region 12 is adjusted to keep the threshold constant. Hence the concentration in the second-conductivity-type base region 12 is decreased with the decrease of the distance x. The calculation was made with the concentration in the highly-doped second-conductivity-type region 17 held constant at $3.0 \times 10^{17}$ cm$^{-3}$. As seen from FIG. 5, the on-resistance $R_{ON}$ starts to prominently decrease for a distance x of 0.3 μm or less.

Returning to FIG. 1, with regard to the width a of the second-conductivity-type contact region 21 and the width b of the second-conductivity-type region 17, the relationship of a<b is preferable. The reason for this is as follows. For example, when a trench to be filled with the second-conductivity-type contact region 21 is formed using a mask, a slight misalignment may occur. In such a case, if the n-type source region 20 is overlapped by the p-type of the second-conductivity-type contact region 21, the n-type resistance may increase. That is, the relationship of a<b is preferable so that the second-conductivity-type contact region 21 with slight misalignment does not adversely affect the n-type source region 20.

Furthermore, denoting by d the depth of the gate electrode 15, and by c the total thickness of the second-conductivity-type base region 12 and the second-conductivity-type contact region 21, the relationship of c≧d is preferable. Under this condition, the gate electrode 15 is not projected from the second-conductivity-type base region 12 into the first-conductivity-type epitaxial layer 11, and the channel length can be reduced. Furthermore, the highly-doped second-conductivity-type region 17 can avoid the short channel effect described above, which otherwise tends to be manifested more significantly than in the case where the gate electrode 15 is projected from the second-conductivity-type base region 12 into the first-conductivity-type epitaxial layer 11.

Figure 6:
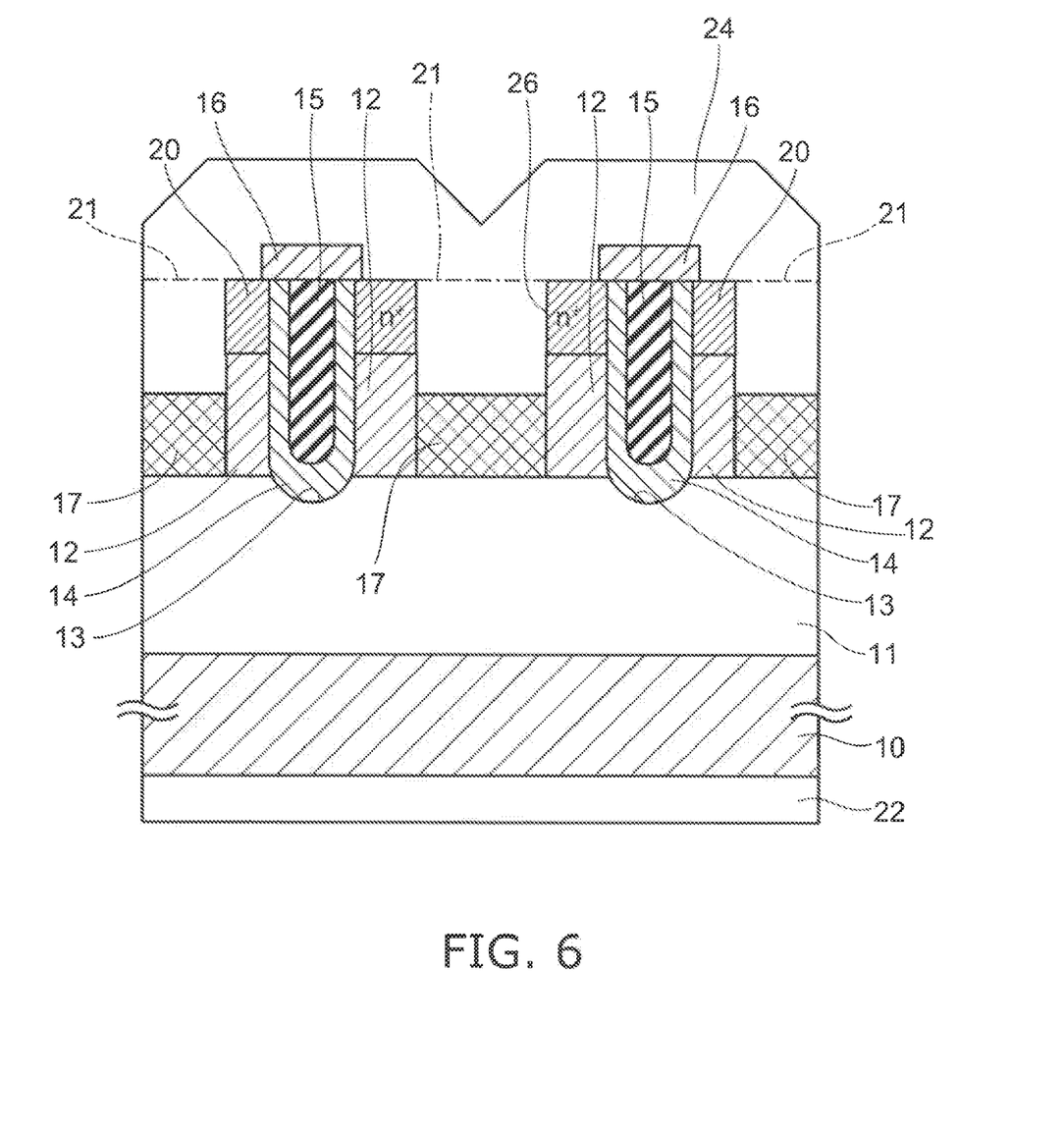
FIG. 6 is a schematic cross-sectional view showing a semiconductor device according to a second embodiment of the invention.

FIG. 6 is a schematic cross-sectional view showing a semiconductor device according to a second embodiment of the invention. With regard to FIG. 6 and the subsequent figures, the same elements as described earlier with reference to the previous figures are labeled with like reference numerals, and the detailed description thereof is omitted as appropriate.

Also in this embodiment, a highly-doped second-conductivity-type region 17 is provided adjacent to the second-conductivity-type base region 12. However, the boundary between these regions is not necessarily clear, but the impurity concentration is continuously varied.

Figure 7A:
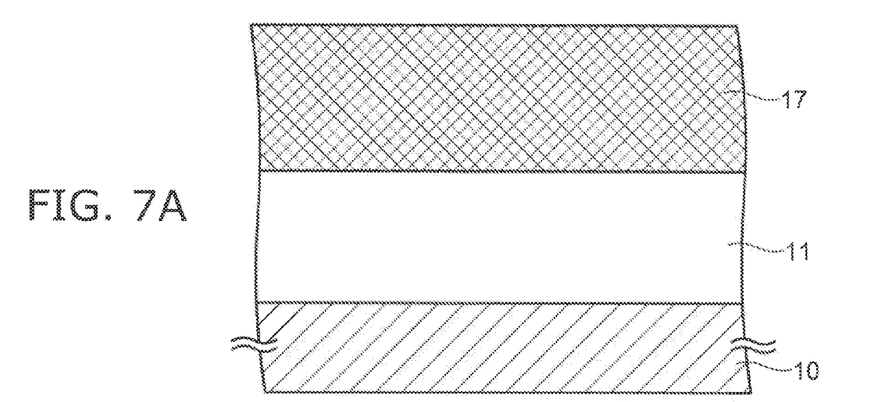
FIGS. 7A to 7C are process cross-sectional views showing a method for manufacturing a semiconductor device of the second embodiment.
Figure 7B:
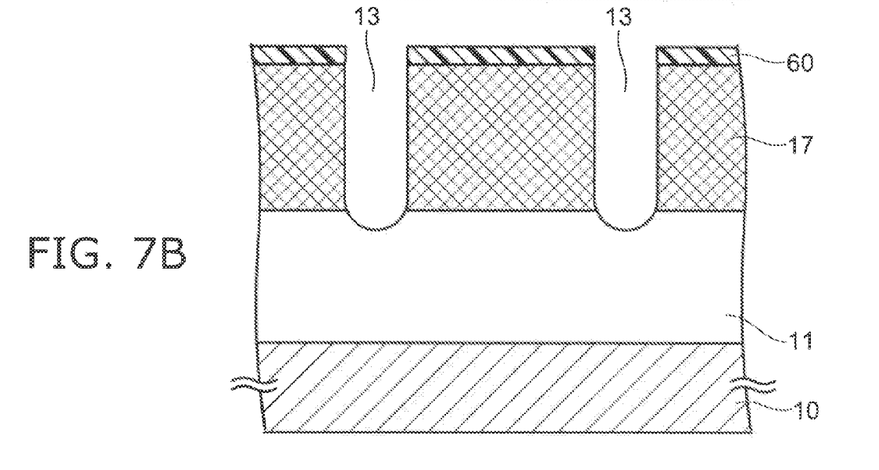
Figure 7C:
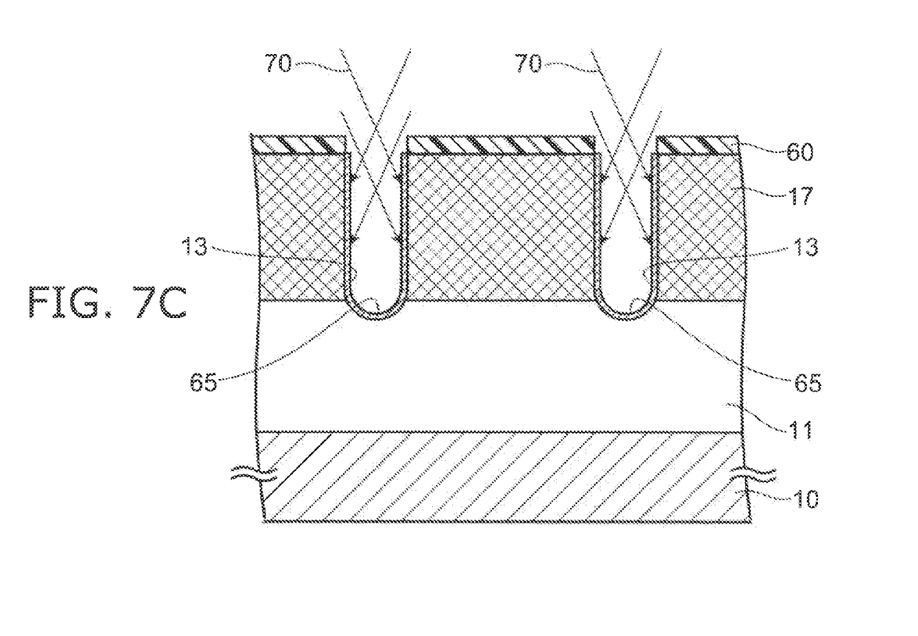
Figure 8A:
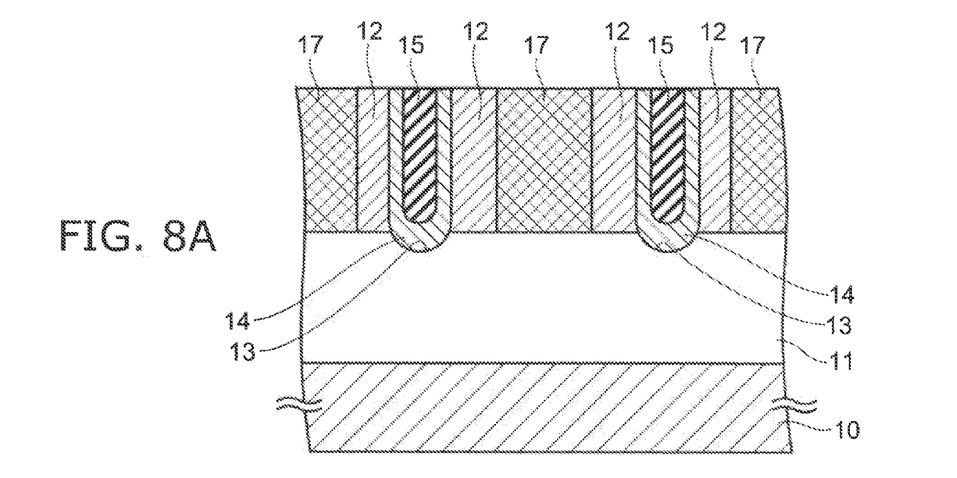
FIGS. 8A to 8C are process cross-sectional views showing a method for manufacturing a semiconductor device of the second embodiment.
Figure 8B:
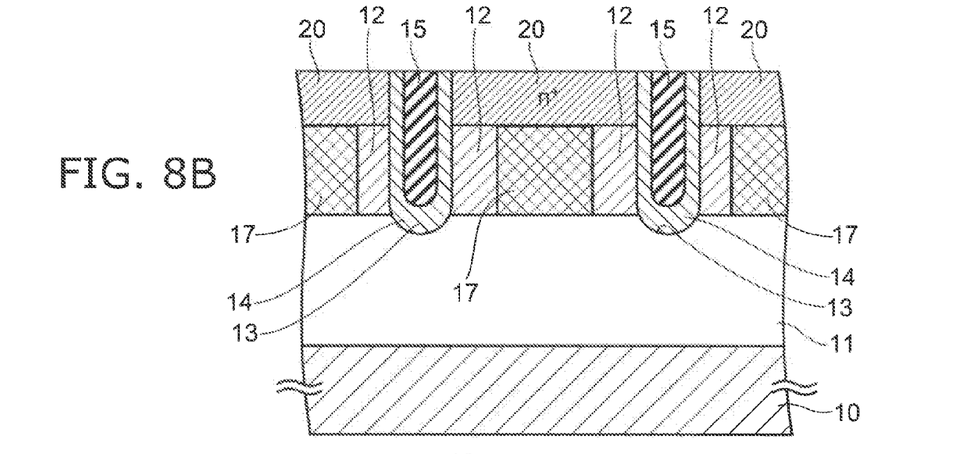
Figure 8C:
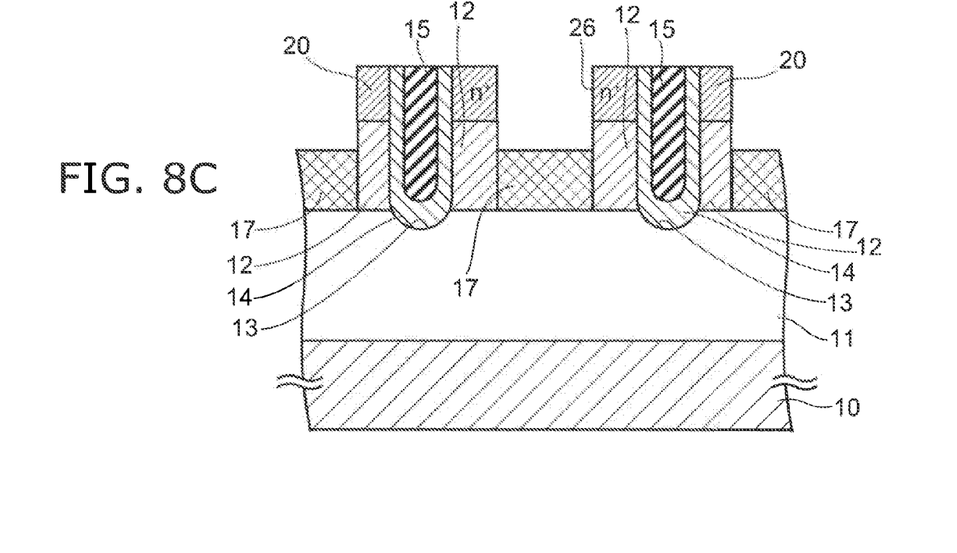

FIGS. 7 and 8 are process cross-sectional views showing a method for manufacturing a semiconductor device of this embodiment.

First, as shown in FIG. 7A, a first-conductivity-type epitaxial layer 11 and a second-conductivity-type region 17 are formed on a low-resistance, first-conductivity-type substrate 10.

Then, as shown in FIG. 7B, partial etching is performed using a mask 60 to form a trench 13 passing through the second-conductivity-type region 17 and reaching the first-conductivity-type epitaxial layer 11.

Next, as shown in FIG. 7C, a thin silicon oxide film 65 is formed on the inner wall of the trench 13. Then, a first-conductivity-type impurity is obliquely ion-implanted into the inner sidewall of the trench 13. Here, the thin silicon oxide film 65 protects the inner wall of the trench 13, and also serves to adjust the implantation depth of the ion-implanted impurity.

Subsequently, the silicon oxide film 65 is removed from the inner wall of the trench 13, and a gate oxide film 14 is newly formed on the inner wall. Furthermore, a conductive material is buried in the trench 13 to form a gate electrode 15. By the heat treatment in these steps or a separate heat treatment performed besides these steps, the first-conductivity-type impurity introduced by the ion implantation described above with reference to FIG. 7C is activated, and the relative concentration of the second-conductivity-type impurity decreases in part of the second-conductivity-type region 17. Thus, as shown in FIG. 8A, a second-conductivity-type base region 12 having a lower concentration than the second-conductivity-type region 17 is formed.

Subsequently, as shown in FIG. 8B, a first-conductivity-type impurity is introduced into the upper portion of the second-conductivity-type base region 12 and the second-conductivity-type region 17 by ion implantation or the like to form a first-conductivity-type source region 20.

Then, as shown in FIG. 8C, the first-conductivity-type source region 20 above the second-conductivity-type region 17 is selectively etched, and part of the second-conductivity-type region 17 therebelow is also etched. Subsequently, an interlayer insulating film 16 is formed on the gate electrode 15, and a source electrode 24 is formed. Thus the semiconductor device shown in FIG. 6 is completed.

According to this embodiment, by oblique ion implantation into the inner sidewall of the trench 13, the second-conductivity-type base region 12 and the second-conductivity-type region 17 can be formed in a prescribed configuration without mask alignment. Furthermore, the on-resistance can be further reduced by forming a trench contact in the source electrode 24.

Figure 9:
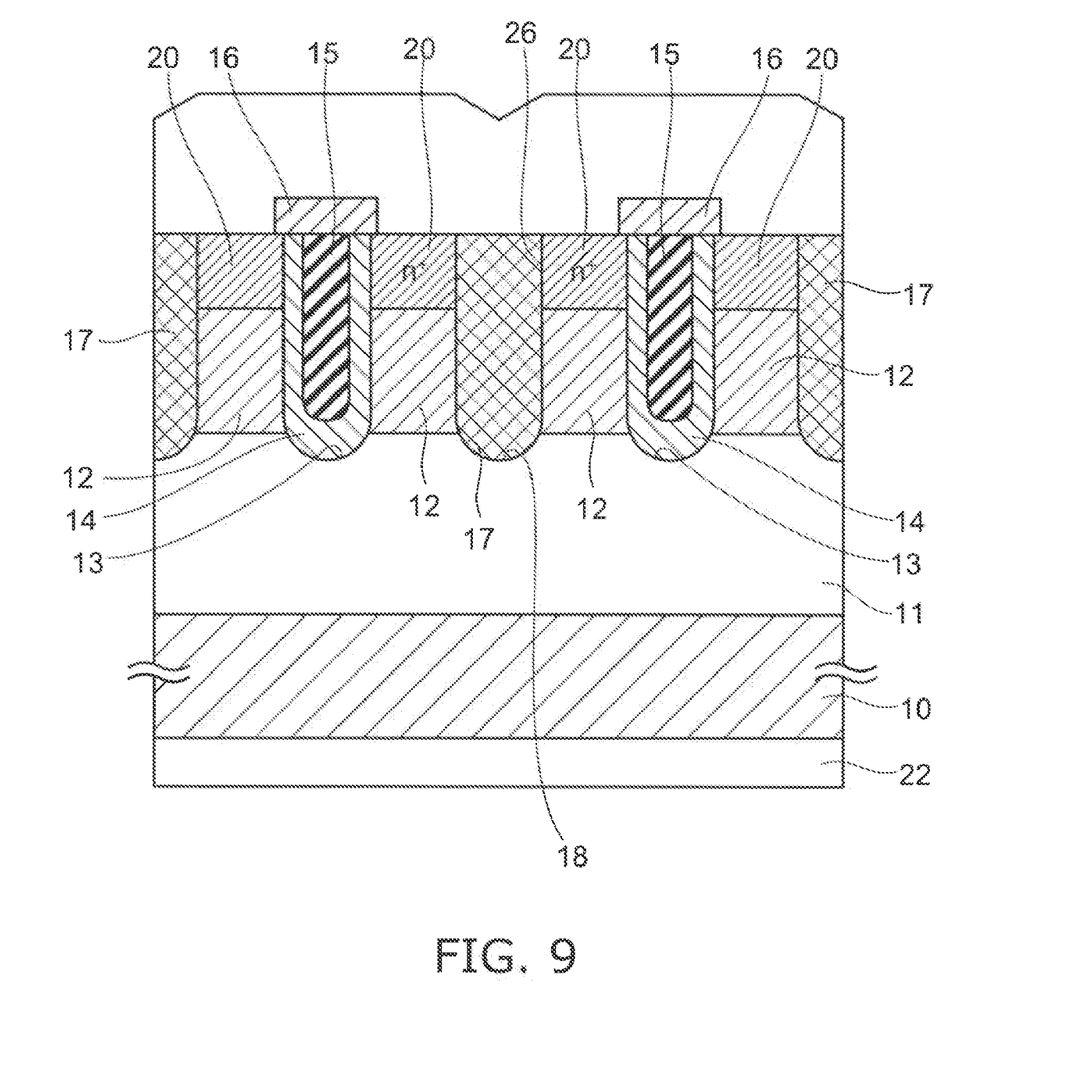
FIG. 9 is a schematic cross-sectional view showing a semiconductor device according to a third embodiment of the invention.

FIG. 9 is a schematic cross-sectional view showing a semiconductor device according to a third embodiment of the invention.

In this embodiment, the second-conductivity-type region 17 is provided in a trench configuration between a pair of gate electrodes 15. As described with reference to the first embodiment, it is desired to form the second-conductivity-type region 17 near the gate oxide film 14 with high positional precision. However, if separate masks are used to form the gate trench 13 and the second-conductivity-type region 17, it is not easy to precisely control the positional relationship therebetween because of mask misalignment. In contrast, in this embodiment, the second-conductivity-type region 17 also has a buried trench structure, and hence can be formed without misalignment using the same mask as the gate.

Figure 10A:
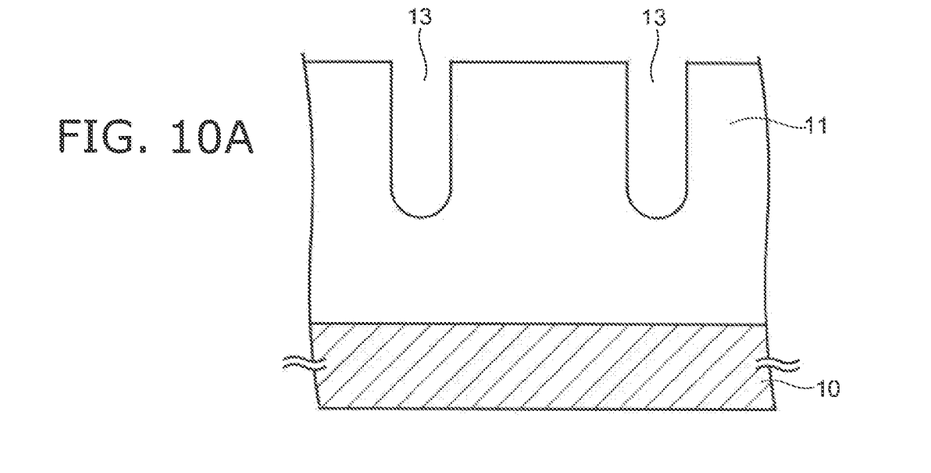
FIGS. 10A to 10C are process cross-sectional views showing a method for manufacturing a semiconductor device of the third embodiment.
Figure 10B:
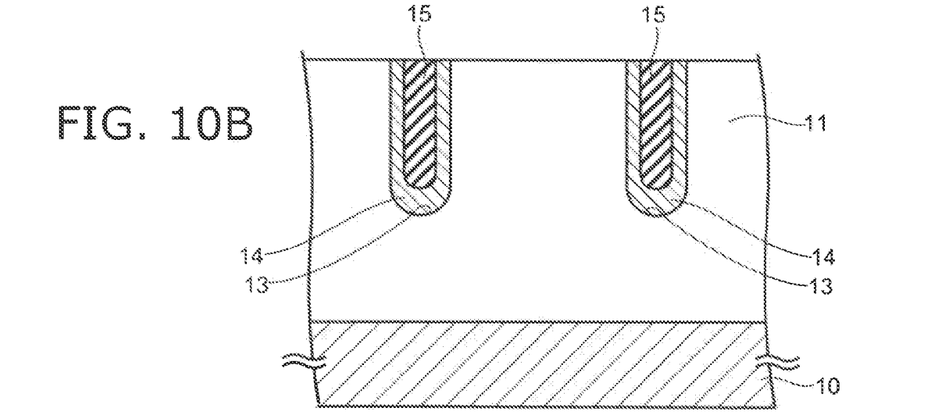
Figure 10C:
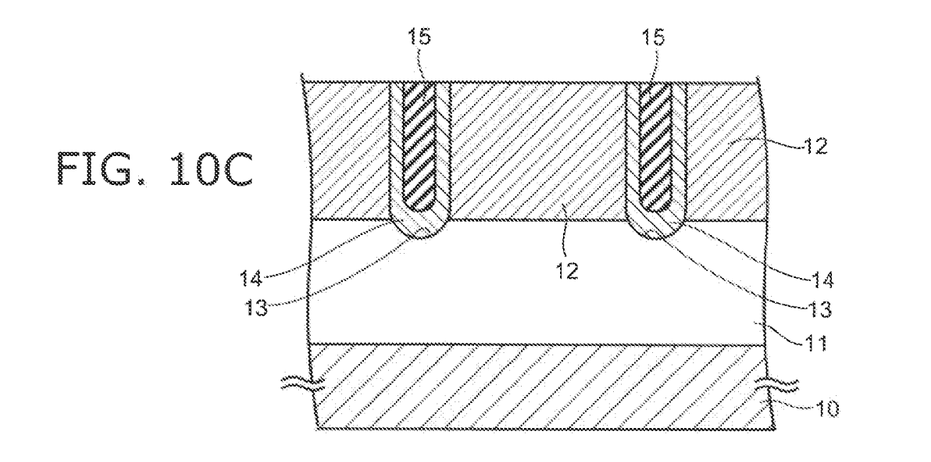
Figure 11A:
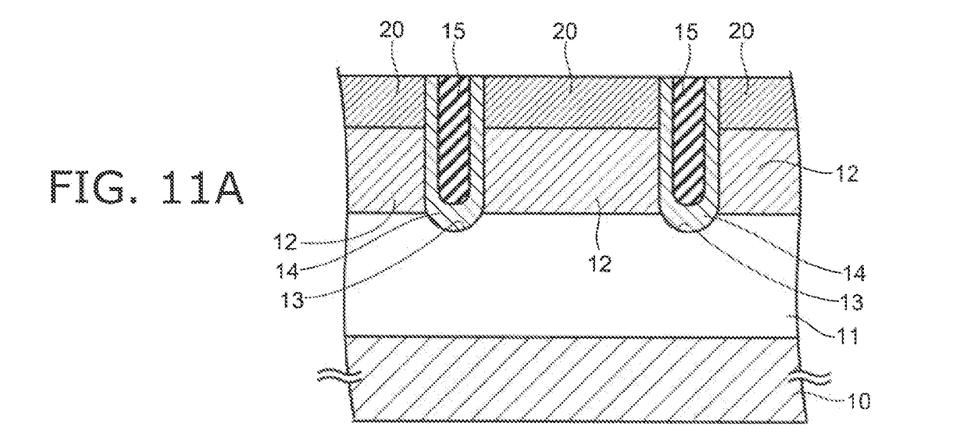
FIGS. 11A to 11C are process cross-sectional views showing a method for manufacturing a semiconductor device of the third embodiment.
Figure 11B:
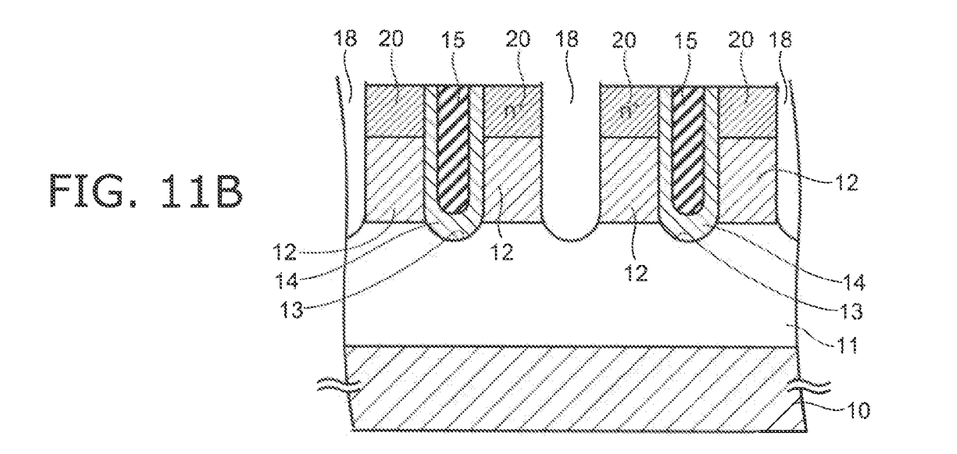
Figure 11C:
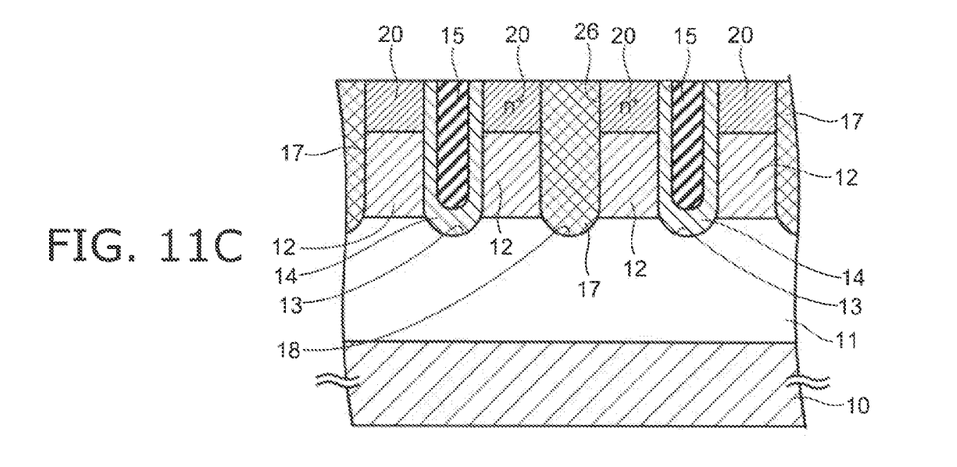

FIGS. 10 and 11 are process cross-sectional views showing a method for manufacturing a semiconductor device of this embodiment.

First, as shown in FIG. 10A, a first-conductivity-type epitaxial layer 11 is formed on a low-resistance, first-conductivity-type substrate 10, and a trench 13 for gate formation is formed. Then, as shown in FIG. 10B, a gate oxide film 14 is formed on the inner sidewall of the trench 13, and a conductive material is further buried therein to form a gate electrode 15.

Next, as shown in FIG. 10C, a second-conductivity-type impurity is introduced by ion implantation or the like from the wafer surface to form a second-conductivity-type base region 12.

Furthermore, as shown in FIG. 11A, a first-conductivity-type impurity is introduced by ion implantation or the like from the wafer surface to form a first-conductivity-type source region 20.

Subsequently, as shown in FIG. 11B, a trench 18 reaching the first-conductivity-type epitaxial layer 11 is formed. Then, a second-conductivity-type semiconductor is buried in the trench 18 to form a second-conductivity-type region 17. Subsequently, a source electrode 24 is formed, and thus the semiconductor device of this embodiment shown in FIG. 9 is completed.

As described above, according to this embodiment, the second-conductivity-type region 17 has a buried trench structure, and can hence be formed using the same mask as the trench gate. This facilitates precisely controlling the positional relationship therebetween.

Figure 12:
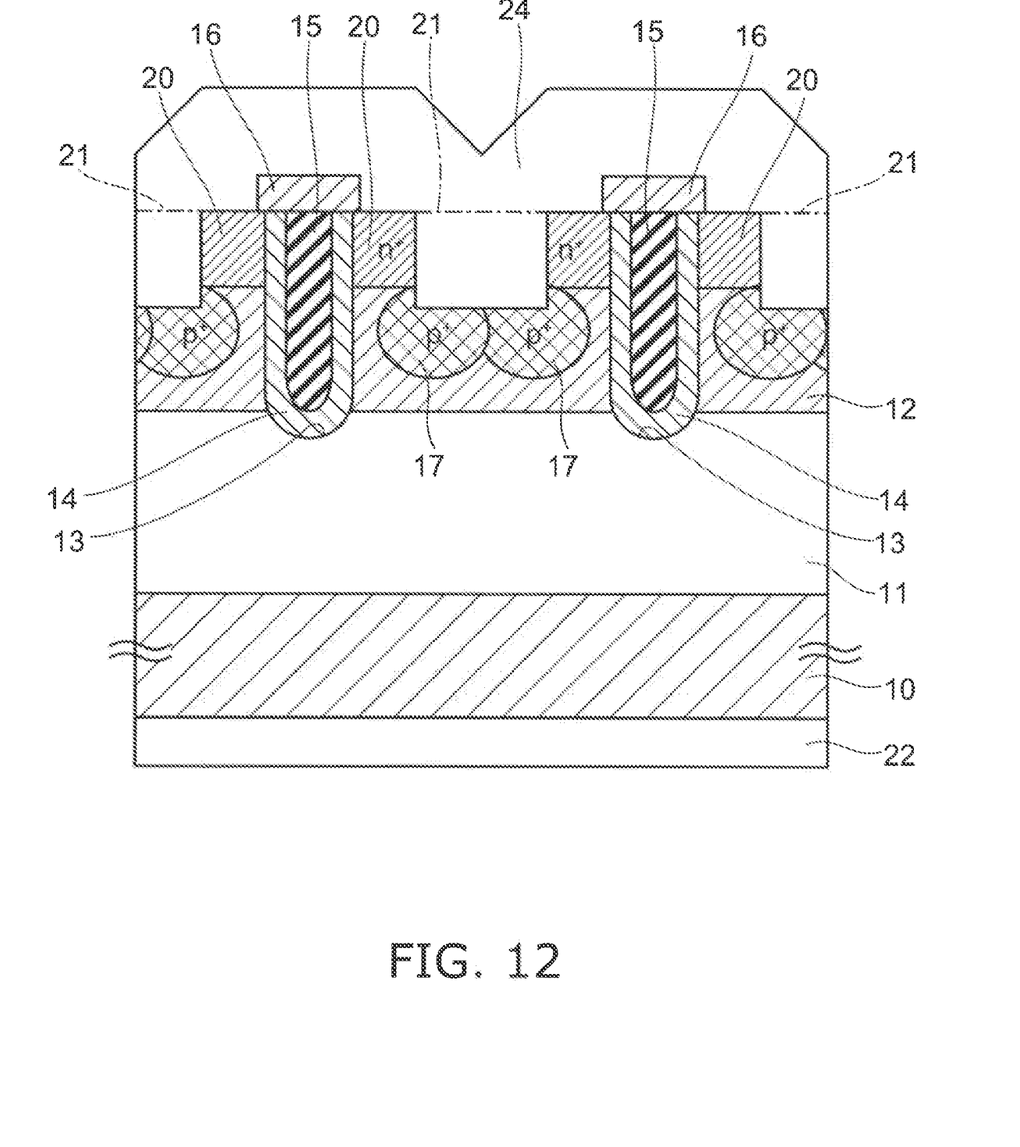
FIG. 12 is a schematic cross-sectional view showing a semiconductor device according to a fourth embodiment of the invention.

FIG. 12 is a schematic cross-sectional view showing a semiconductor device according to a fourth embodiment of the invention.

In this embodiment, the second-conductivity-type region 17 is formed adjacent to the trench contact of the source electrode 24. This structure also allows the second-conductivity-type region 17 to be formed near the trench gate.

Figure 13A:
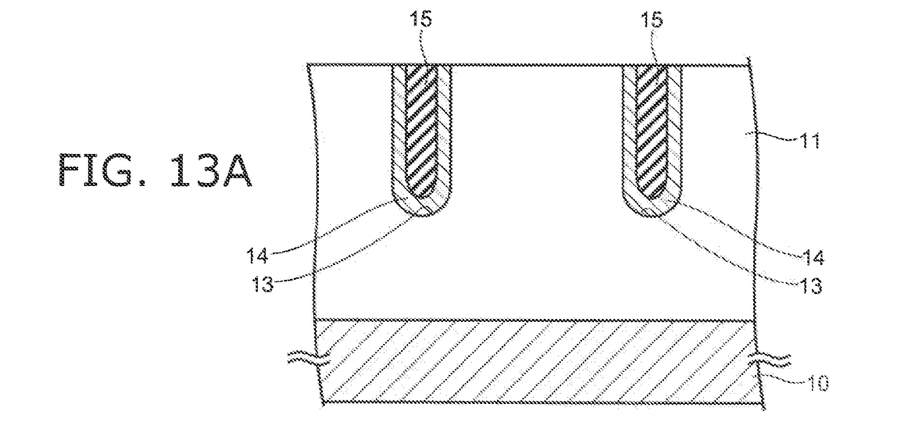
FIGS. 13A to 13C are process cross-sectional views showing a method for manufacturing a semiconductor device of the fourth embodiment.
Figure 13B:
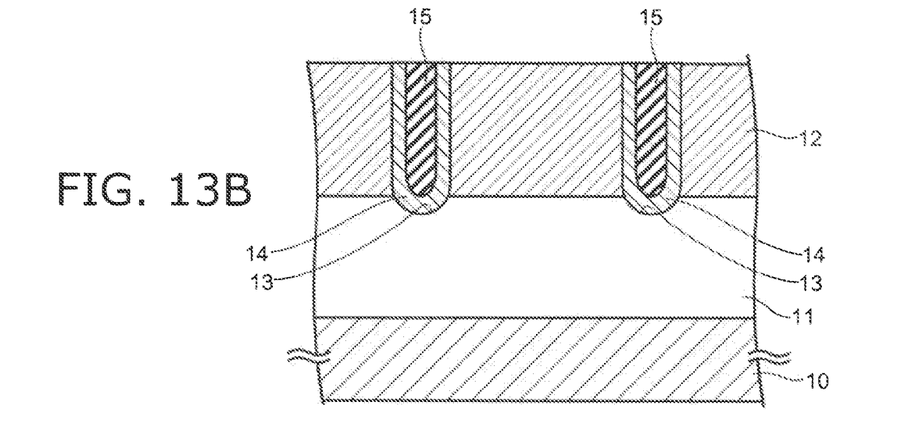
Figure 13C:
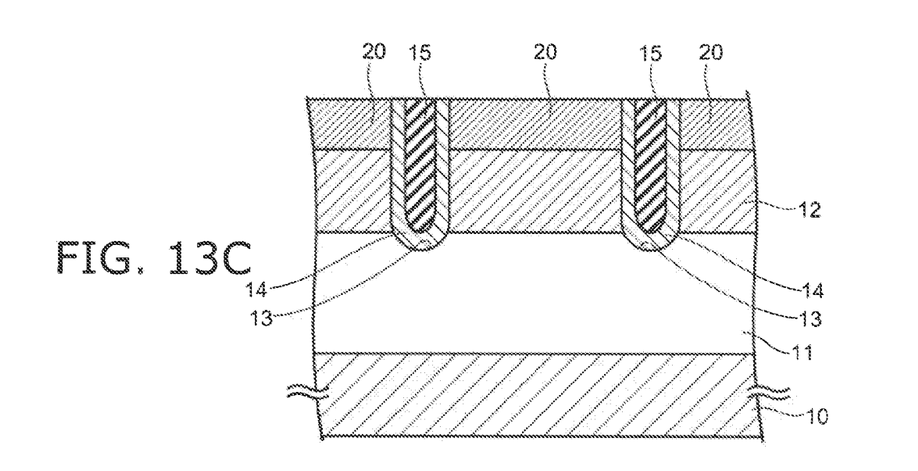
Figure 14A:
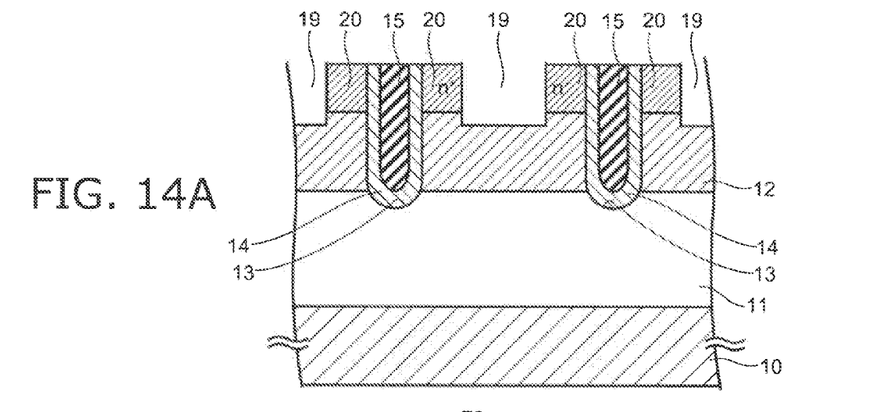
FIGS. 14A to 14C are process cross-sectional views showing a method for manufacturing a semiconductor device of the fourth embodiment.
Figure 14B:
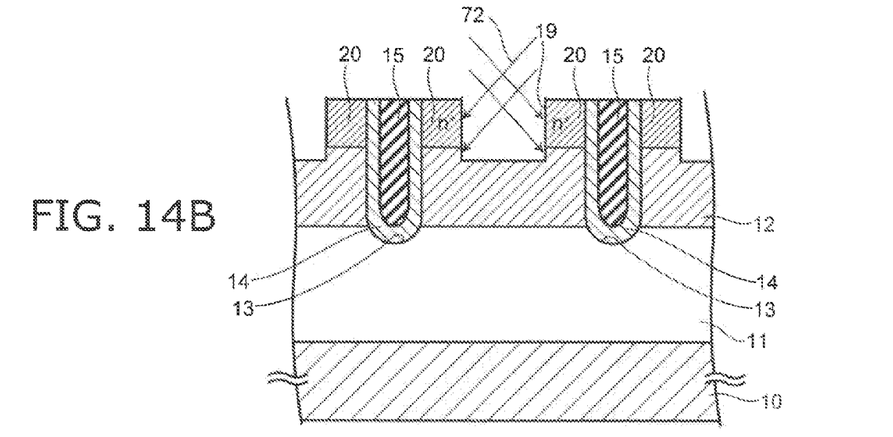
Figure 14C:
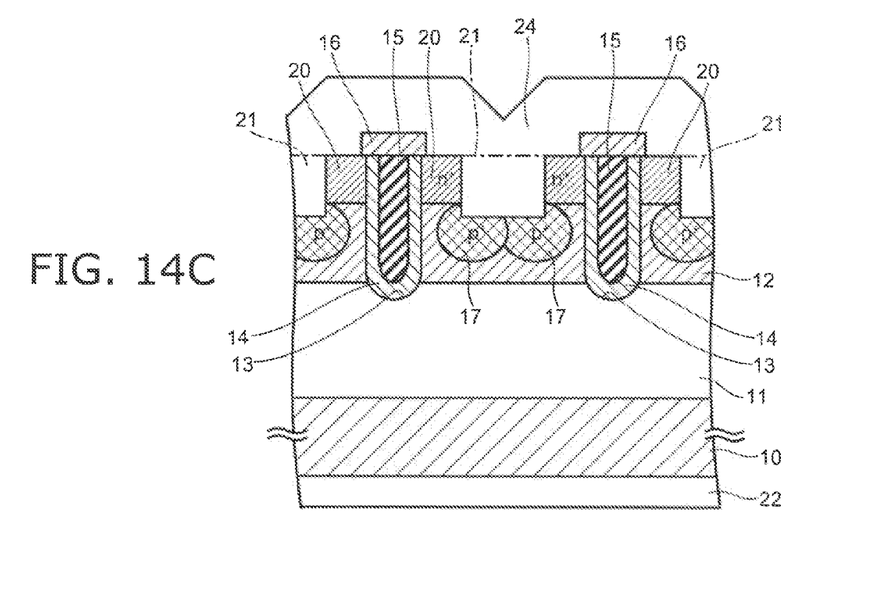

FIGS. 13 and 14 are process cross-sectional views showing a method for manufacturing a semiconductor device of this embodiment.

First, as shown in FIG. 13A, a first-conductivity-type epitaxial layer 11 is formed on a low-resistance, first-conductivity-type substrate 10. A trench 13 is formed, a gate oxide film 14 is formed on the inner sidewall thereof, and a gate electrode 15 is formed. Then, as shown in FIG. 13B, a second-conductivity-type impurity is introduced by ion implantation or the like from the wafer surface to form a second-conductivity-type base region 12. Here, the second-conductivity-type base region 12 is formed shallower than the trench 13.

Next, as shown in FIG. 13C, a first-conductivity-type impurity is introduced by ion implantation or the like from the wafer surface to form a first-conductivity-type source region 20.

Subsequently, as shown in FIG. 14A, a trench 19 for the trench contact of the source electrode 24 is formed.

Then, as shown in FIG. 14B, a second-conductivity-type impurity is obliquely ion-implanted into the bottom and inner side surface of the trench 19.

Subsequently, the ion-implanted impurity is activated by heat treatment to form a second-conductivity-type region 17. Then a source electrode 24 is formed, and thus the semiconductor device of this embodiment shown in FIG. 12 is completed.

As described above, according to this embodiment, the second-conductivity-type region 17 can be formed near the trench gate by obliquely ion-implanting a second-conductivity-type impurity into the trench 19 for the trench contact of the source electrode 24.

The features of the invention have been described with reference to the examples. However, the invention is not limited to these examples. For instance, any combinations of two or more of these examples are also encompassed within the scope of the invention. Furthermore, those skilled in the art can suitably make design change as well as addition or deletion of components on any of the above examples without departing from the spirit of the invention, and such variations are also encompassed within the scope of the invention.

The invention claimed is:

1. A semiconductor device comprising:
   a second-conductivity-type base region provided on a first-conductivity-type semiconductor layer;
   a first-conductivity-type source region provided on the second-conductivity-type base region;
   a gate insulating film covering an inner wall of a trench which passes through the second-conductivity-type base region and reaching the first-conductivity-type semiconductor layer;
   a gate electrode buried in the trench via the gate insulating film;
   a second-conductivity-type region being adjacent to the second-conductivity-type base region below the first-conductivity-type source region, spaced from the gate insulating film, and having a higher impurity concentration than the second-conductivity-type base region; and
   a second-conductivity-type contact region provided on the second-conductivity-type region and being adjacent to the first-conductivity-type source region,
   $c \geq d$ being satisfied, where d is a depth from an upper surface of the first-conductivity-type source region to a lower end of the gate electrode, and c is a depth from an upper surface of the first-conductivity-type source region to a lower surface of the second-conductivity-type base region, wherein a distance from the gate insulating film to the second-conductivity-type region is 0.3 micrometers or less.

2. The semiconductor device according to claim 1, wherein a width of the second-conductivity-type region measured in a direction perpendicular to a depth of the trench is larger than a width of the second-conductivity-type contact region measured in the direction perpendicular to the depth of the trench.

3. The semiconductor device according to claim 1, wherein a dose amount f in the second-conductivity-type region and a distance x from the gate insulating film to the second-conductivity-type region satisfy a condition, $x \leq 0.14 \times f \times 10^{-17} + 0.022$.

4. The semiconductor device according to claim 1, wherein an impurity concentration is continuously varied between the second-conductivity-type region and the second-conductivity-type base region.

5. The semiconductor device according to claim 4, wherein the second-conductivity-type base region is formed by introducing a first-conductivity-type impurity into an inner sidewall of the trench.

6. The semiconductor device according to claim 1, wherein the second-conductivity-type region is buried in a trench which passes through the second-conductivity-type base region and reaching the first-conductivity-type semiconductor layer.

7. The semiconductor device according to claim 1, wherein the second-conductivity-type region is formed by introducing a second-conductivity-type impurity into an inner sidewall of a trench which is formed in the first-conductivity-type source region.

8. The semiconductor device according to claim 1, further comprising a source electrode which is buried in a trench which is formed in the first-conductivity-type source region.

9. The semiconductor device according to claim 1, wherein the impurity concentration in the highly-doped second-conductivity-type region is $1.8 \times 10^{17}$ to $3 \times 10^{17}$ cm$^{-3}$.

* * * * *